(12) United States Patent
Brewerton et al.

(10) Patent No.: US 9,727,502 B2
(45) Date of Patent: Aug. 8, 2017

(54) SYSTEM AND METHOD FOR DIRECT MEMORY ACCESS TRANSFERS

(71) Applicant: Infineon Technologies AG, Neubiberg (DE)

(72) Inventors: Simon Brewerton, Trowbridge (GB); Simon Cottam, Bristol (GB)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 13/951,518

(22) Filed: Jul. 26, 2013

(65) Prior Publication Data
US 2015/0032914 A1 Jan. 29, 2015

(51) Int. Cl.
G06F 13/28 (2006.01)
G01R 31/3193 (2006.01)
G06F 13/42 (2006.01)
G06F 13/18 (2006.01)

(52) U.S. Cl.
CPC ........ *G06F 13/28* (2013.01); *G01R 31/31937* (2013.01); *G06F 13/18* (2013.01); *G06F 13/287* (2013.01); *G06F 13/4269* (2013.01)

(58) Field of Classification Search
None
See application file for complete search history.

(56) References Cited

U.S. PATENT DOCUMENTS

| | | | |
|---|---|---|---|
| 6,971,046 B1 * | 11/2005 | Johnson | G06F 11/273 714/25 |
| 7,433,977 B2 * | 10/2008 | Barrow et al. | 710/22 |
| 7,995,587 B2 * | 8/2011 | Komoriya | 370/395.64 |
| 2006/0184949 A1 * | 8/2006 | Craddock | G06F 9/546 719/314 |
| 2010/0057388 A1 * | 3/2010 | LeBrun | H04L 12/403 702/67 |
| 2010/0257298 A1 * | 10/2010 | Cummings | G06F 13/28 710/301 |
| 2013/0246736 A1 * | 9/2013 | Hontani | G06F 11/28 712/30 |
| 2014/0281152 A1 * | 9/2014 | Karamcheti | G06F 12/0246 711/103 |

FOREIGN PATENT DOCUMENTS

CN 102136841 A 7/2011

OTHER PUBLICATIONS

Atmel, Manchester Coding Basics, 2009, Atmel, pp. 1-24.*

* cited by examiner

*Primary Examiner* — Henry Tsai
*Assistant Examiner* — Aurangzeb Hassan
(74) *Attorney, Agent, or Firm* — Eschweiler & Potashnik, LLC

(57) ABSTRACT

A system and method for transferring data between a memory and peripheral units via a plurality of direct memory access (DMA) transactions, wherein a respective timestamp is assigned and/or appended to at least two of the plurality of the DMA transactions.

10 Claims, 4 Drawing Sheets

SYSTEM AND METHOD FOR DIRECT MEMORY ACCESS TRANSFERS

FIELD OF THE DISCLOSURE

Certain embodiments of the present disclosure relate to a system and method for direct memory access transfers. More specifically, certain embodiments of the disclosure relate to a system and method for transferring data between a memory and peripheral units via a plurality of direct memory access transactions.

BACKGROUND OF THE DISCLOSURE

Direct memory access (DMA) is a feature of modern computers that allows certain hardware subsystems within the computer to access system memory for reading and/or writing independently of a central processing unit (CPU). Many hardware systems use DMA including disk drive controllers, graphics cards, network cards, and sound cards. Computers provided with DMA channels can typically transfer data to and from devices with much less CPU overhead than computers without a DMA channel.

DMA is commonly used to allow devices to transfer data without exposing the CPU to a heavy load. If the CPU had to copy each piece of data from the source to the destination, this would be typically slower than copying normal blocks of memory, since access to I/O devices over a peripheral bus is generally slower than normal system RAM. During this time the CPU would be unavailable for other tasks involving CPU bus access, although it could continue doing any work which did not require bus access.

A DMA transfer essentially copies a block of memory from one device to another. While the CPU initiates the transfer, it does not execute it. The transfer is usually performed by a DMA controller which is typically part of a motherboard chipset. A typical usage of DMA is copying a block of memory from system RAM to or from a buffer on the device, wherein the operation does not need much capacity of the processor, which as a result can be scheduled to perform other tasks. DMA is therefore essential to high performance embedded systems.

The DMA controller generally transfers data from a data source location to a data destination location. In some applications, DMA transfers are used in safety critical systems, wherein it is important that the DMA transfers perform the correct transfer operation. DMA operations may be particularly difficult to check as the autonomous nature of the process requires substantial supervision.

In particular, when a DMA is used to automatically unload data from an autonomous peripheral unit, such as serial interface, Analogue to Digital Converter (ADC), or input capture system, in a periodic way, it is often configured to move data from the peripheral unit to one or more memory buffers. The data that appears in the memory buffer is typically used by the control system for real-time control of the system actuators and communication interfaces. The data therefore has a temporal aspect, as the system should only be using current data that has just been transferred, rather than historical data. It is important to know that the data buffer has been refreshed since last time the data was used. Therefore, the CPU has to check the operation of the DMA transfers in real time, which requires a low latency service that is CPU intensive.

Typically, a known DMA peripheral performs data transactions within an embedded system which also comprises a host CPU. The CPU is responsible for supervising the correct operation of the DMA. A sequence of linked DMA transactions is correctly ordered by configuring the DMA and Interrupt Router to trigger the start of a new DMA transaction on completion of the preceding transaction in the sequence. A sequence of linked DMA transactions is usually ordered by either of the following methods:

Configuring the DMA controller and interrupt router, such that the completion of an on-going DMA transaction initiates the start of the next DMA transaction via a hardware trigger.

The CPU intervenes between DMA transactions and initiates the start of the next DMA transaction via a software trigger on receiving a DMA traffic management semaphore that the preceding DMA transaction has completed.

US 2009/0271536 discloses a DMA controller that conditionally executes I/O descriptors, wherein a linked list item contains a checksum computed on the descriptor fields. When the linked list item is fetched, the checksum is computed on the descriptor. If both checksums are equal, the linked list item is considered valid and the descriptor is executed. At the end of a DMA I/O, the next descriptor in the linked list is fetched. When the checksum fails, the descriptor is corrupted and the channel is stopped and an error is reported to the operating system.

These known approaches involve the following disadvantages:

The verification of the temporal sequence of DMA data moves requires intervention by the CPU to confirm the sequencing of events while a sequence of DMA transactions is in progress.

Post-processing of the DMA state does not guarantee correct operation.

Post-processing of the destination data that has been moved is CPU intensive.

The present disclosure faces the challenge to provide solutions to the above mentioned problems.

SUMMARY

According to one embodiment the present disclosure provides a system and method for transferring data between a memory and peripheral units via a direct memory access (DMA) transaction, operation or event. The system and method includes the assignment or appendage of a respective timestamp to a DMA transaction, such that the relative timing of different DMA transactions can be compared. This mechanism and assigned or appended timestamp can be used to support tracking of different DMA events or transactions.

According to another embodiment the present disclosure provides a system and mechanism for assigning or appending a respective timestamp to the destination data at the end of a DMA transaction. The timestamps assigned or appended to the destination data of the DMA transaction, operation or event provide a means for comparing the relative temporal completion of the respective DMA transactions.

According to still another embodiment the present disclosure provides a system and mechanism for reporting of DMA timestamps to a host CPU. This reporting of DMA timestamps to the host CPU allows the CPU to check the internal processing of the DMA events or transactions. Thereby, correct sequencing of DMA transactions can be confirmed. The CPU can also detect an incorrect rate of the DMA operations, such as latency, arrival rate, missing and/or repeated sequences.

According to an embodiment of the present disclosure a respective timestamp is appended to the final destination data written during the last DMA write move of a DMA transaction.

According to another embodiment of the present disclosure a timestamp is generated from an incrementing binary sequence, e.g., a free running binary counter, and may support comparison and arithmetic operations.

According to another embodiment of the present disclosure, when a final DMA transfer of a sequence is completed, an additional transfer can be automatically performed to capture the current value of a free running timer counter and move the current value to the next address in the destination memory structure.

According to another embodiment of the present disclosure the timestamps can be post processed to check the temporal sequence of DMA transactions. This post processing of timestamps may enable the temporal checking of the sequence of DMA transactions.

According to another embodiment of the present disclosure the destination address of the timestamp can be calculated from the DMA transaction control set. The timestamp can be interrogated to confirm the sequence of a series of DMA transactions.

According to another embodiment of the present disclosure the destination address of the timestamp can be calculated from the DMA transaction controller or control set. In this application the timestamp can be interrogated to confirm the sequence of a series of DMA transactions.

According to another embodiment the present disclosure can be used in motor control applications of a vehicle. If an ADC is used to sample the effective motor current, e.g. via a resistive shunt or Hall effect sensor, the current correlates to the instantaneous motor torque. Since the motor torque is a key safety concern, the timestamp shows that the ADC was successfully triggered and converted at the right time.

According to another embodiment the present disclosure a timestamp is assigned to the data to be transferred between a memory and one or more peripheral units, wherein the data is transferred by direct memory access (DMA) control between the memory and the one or more peripheral units together with the timestamp assigned and/or appended to each DMA transaction, operation or event.

In this application the ADC needs to be triggered at a point in time that is synchronized with the motor pulse-width modulation (PWM) phasing, since if the motor is sampled at the wrong time, the control loop may be unstable and the reported torque can be incorrect. Therefore, the ADC is triggered from a timer that also does the motor phasing, but if the comparison or the timer are disturbed or not at the right rate, then malfunction may result.

The present disclosure provides a DMA controller that implements timestamp functionality. The present disclosure provides a new capability that enables a unique method for:

Proving that the operation of the DMA was triggered by the right event.

Proving the destination data has been refreshed by a new block of data.

Thus, the present disclosure provides an advantageous contribution to current implementations in the art, wherein the ADC plausibility has been difficult to determine so far, unless a true Interrupt Service Routine is used. In known applications the CPU can merely unload the ADC and also read an independent timer to verify that the trigger event occurs at the right time. Typically the motor phasing is at 50 µs rate and this creates a substantial interrupt loading especially as 2 or 3 ADC measurements are required per motor commutation cycle and an application can have multiple motors controlled by one core.

These and other advantages, aspects and novel features of the present disclosure, as well as details of an illustrated embodiment thereof, will be more fully understood from the following description and drawings.

BRIEF DESCRIPTION OF THE DRAWINGS

The accompanying drawings are included to provide a further understanding of the present disclosure and are incorporated in and constitute a part of this specification. The drawings illustrate the embodiments of the present disclosure and together with the description serve to explain the principles of the disclosure. Other embodiments of the present disclosure and many of the intended advantages of the present disclosure will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

The present disclosure relates to transferring data between a memory and a peripheral unit, such as, for example, as serial interface, a switch or a router, etc., employing direct memory access control (DMA).

Figure 1:
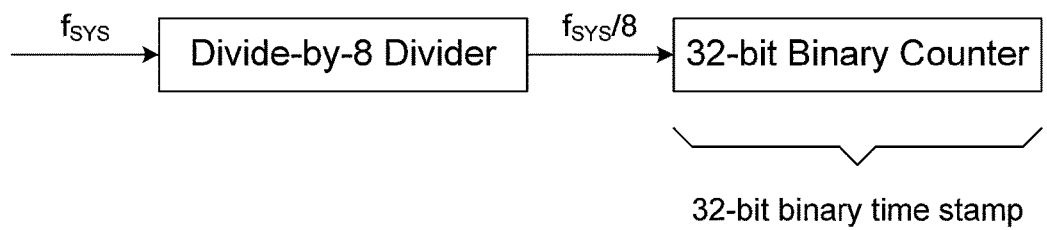
FIG. 1 is a schematic diagram illustrating a timestamp generation according to an embodiment according to the present disclosure.

FIG. 1 shows a schematic diagram illustrating an embodiment according to the present disclosure. In this embodiment of the present disclosure the timestamp generation can be performed as follows:

A system clock is divided by 8 to generate a slower timestamp base clock to clock a 32-bit upwards synchronous counter. The counter starts automatically after reset and the 32-bit binary timestamp increments on each rising edge of the timestamp base clock. The 32-bit binary timestamp continuously increments while the system clock is running guaranteeing uniqueness to each timestamp value.

The timestamp can only be changed by the assertion of a reset which returns the timestamp to its initial value. On releasing the reset, the timestamp resumes an upwards count sequence. In case the timestamp overflows a predetermined threshold, the timestamp toggles back to the initial value and resume an upwards count sequence. The timestamp value can be read by a suitable software, for instance.

With reference to FIG. 1, provided the system clock frequency $f_{SYS}$ is 100 MHz, then the divide-by-8 divider may generate a 12.5 MHz timestamp input clock. Therefore, the 32-bit binary timestamp counter increments every 80 ns. In one embodiment the timestamp increments at a rate consistent with the rate of DMA transactions. If the timestamp increments at a rate faster than the rate of DMA transactions, it may overflow too often which consumes excessive power. If the timestamp increments at a rate lower than the rate of DMA transactions, a DMA transaction may not be provided with a unique timestamp.

Figure 2:
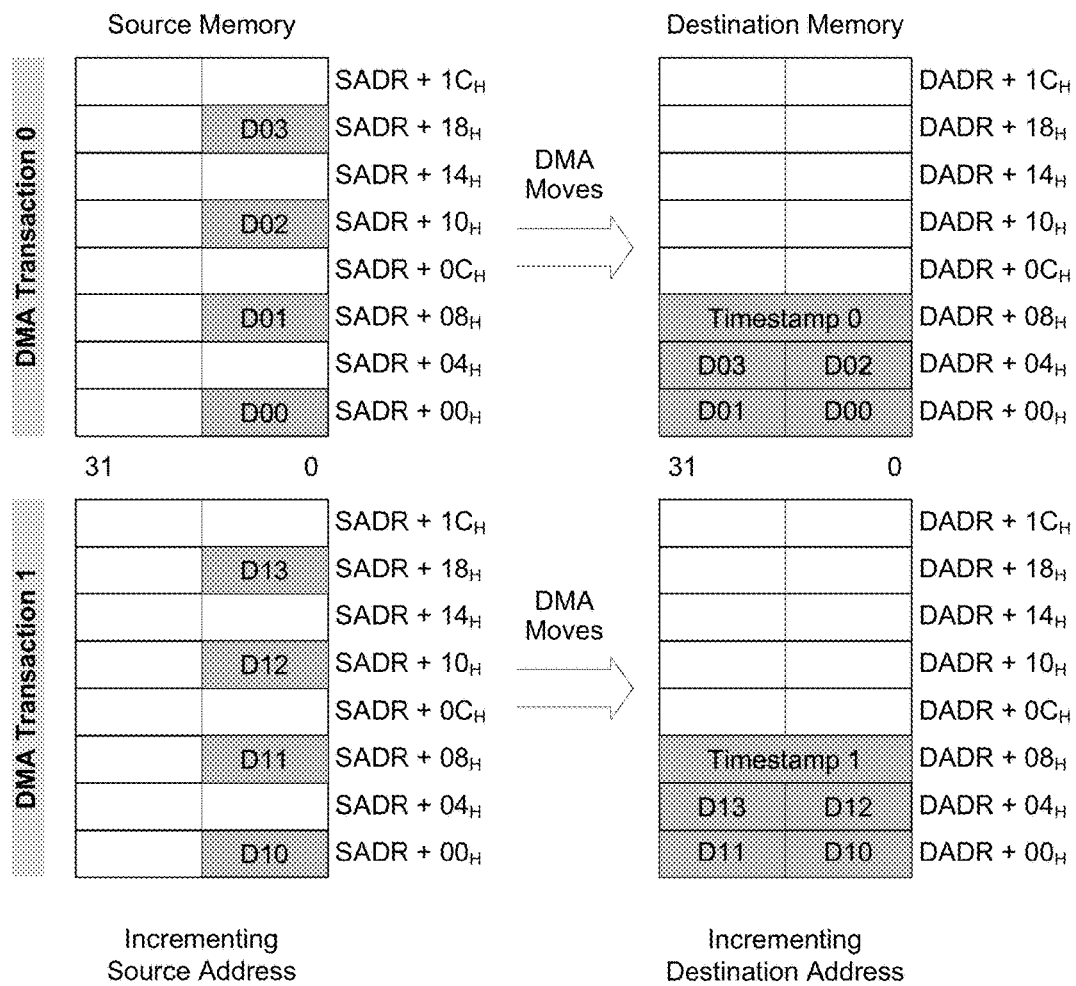
FIG. 2 is a schematic diagram illustrating a DMA transfer with an appendage of a timestamp to 32-bit source data in accordance with an embodiment of the present disclosure.

FIG. 2 shows a schematic diagram illustrating a DMA event or transfer in accordance with an embodiment of the present disclosure. In FIG. 2, a source memory and a destination memory are shown with an incrementing source address $1C_H$, $18_H$, $14_H$, $10_H$, $0_H$, $08C_H$, $04C_H$, $00C_H$, respectively. In the illustrated example, during the DMA transfer, operation or transaction two 16-bit half words illustrated by bit numbers 0-15 and 16-31 are transferred via a DMA transfer, operation or transaction from a source memory with incrementing source addresses $1C_H$, $18_H$, 14H, $10_H$, 0H, $08C_H$, $04C_H$, $00C_H$ to a destination memory with incrementing destination addresses $1C_H$, $18_H$, $14_H$, $10_H$, $08C_H$, $04C_H$, $00C_H$. In this DMA transfer, a respective timestamp is appended at the next immediately higher 32-bit aligned destination address at the end of DMA transaction destination data. In the illustrated example, the timestamp is stored at the destination address $08_H$.

FIG. 2 is a schematic diagram illustrating a DMA transfer with an appendage of a timestamp to 32-bit source data in accordance with an embodiment of the present disclosure. The appendage of a timestamp is described in the following by means of an example with reference to FIG. 2.

A DMA channel is configured to perform a DMA transaction composed of four DMA moves. Each DMA move transfers a 16-bit data sample from a source address to a destination address. The four 16-bit data samples at source addresses are re-packed as two 32-bit words at contiguous destination addresses. The transfer of the four data samples by the DMA controller is a repetitive task. The DMA transaction control set is configured as a circular buffer. The DMA channel is configured to append a respective timestamp at the end of a DMA transaction as shown in the example. The timestamp appended at the end of the current DMA transaction is different to the timestamp appended at the end of the next DMA transaction. The DMA moves the four data samples as shown in the following exemplary table:

| Data Sample | Source | Destination |
| --- | --- | --- |
| Data Sample Dn0 | SADR + $00_H$ | DADR + $00_H$ |
| Data Sample Dn1 | SADR + $08_H$ | DADR + $02_H$ |
| Data Sample Dn2 | SADR + $10_H$ | DADR + $04_H$ |
| Data Sample Dn3 | SADR + $18_H$ | DADR + $08_H$ |

Each repetition of the DMA transaction results in four DMA moves overwriting the data samples stored at destination addresses. Each DMA move overwrites a data sample at a source address.

Assuming that the four data samples are analyzed by the CPU, during each analysis the CPU can copy the timestamp to another address. When the CPU performs the next analysis it can compare the timestamps to check for any differential value. If the timestamps are not different, then the CPU checks whether new data samples have been loaded. If the timestamps are different, then the CPU checks whether the current timestamp is greater than the previous timestamp. Typically the current timestamp is greater than the previous timestamp unless the binary timestamp counter has overflowed. As a result, analyzing the timestamps generated in accordance with the present disclosure allows the user to determine if a DMA transaction has occurred.

Figure 3:
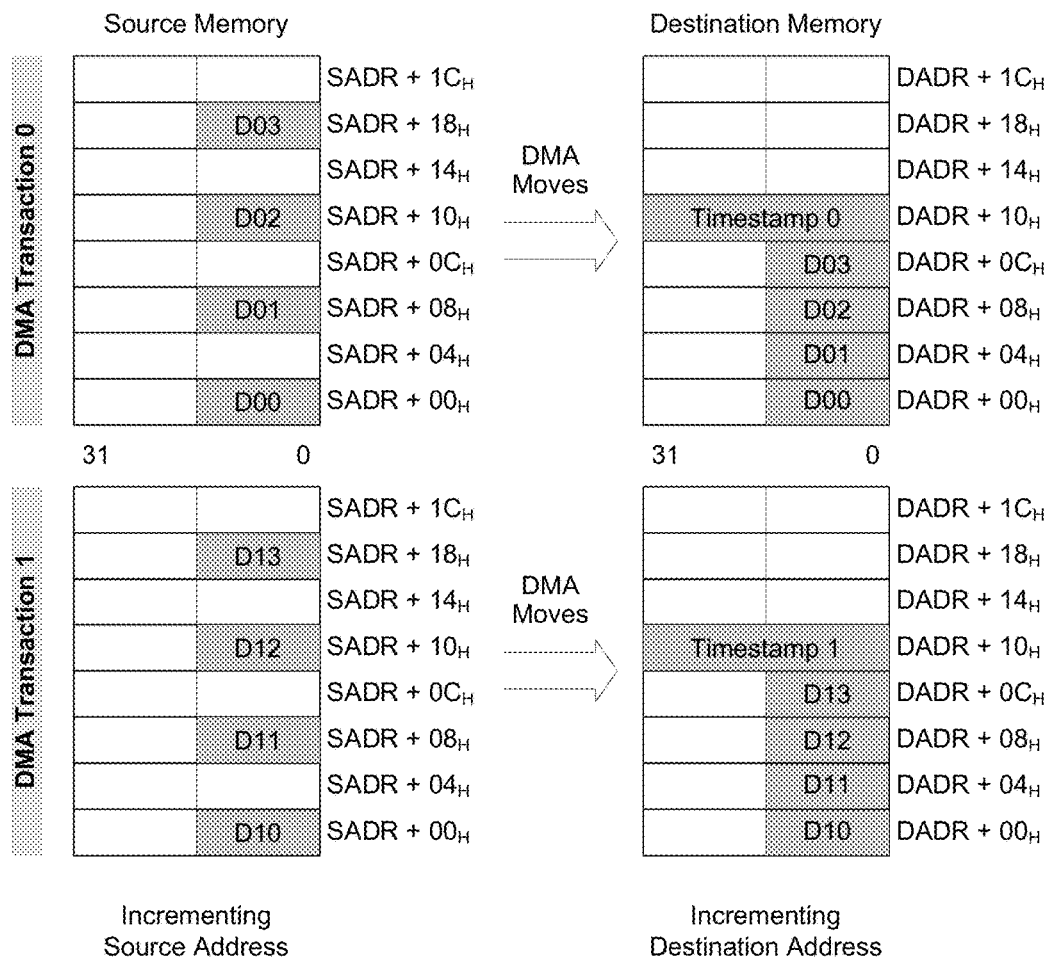
FIG. 3 is a schematic diagram illustrating a DMA transfer with an appendage of a timestamp to 16-bit source data in accordance with another embodiment of the present disclosure.

FIG. 3 is a schematic diagram illustrating a DMA transfer with an appendage of a timestamp to 16-bit source data according to another embodiment of the present disclosure. In this embodiment the timestamp is appended at the next immediately higher 32-bit aligned destination address at the end of DMA transaction destination data.

The DMA transaction stores the four 32-bit samples at 32-bit aligned destination addresses, and the timestamp is written at the next higher 32-bit aligned destination address.

Figure 4:
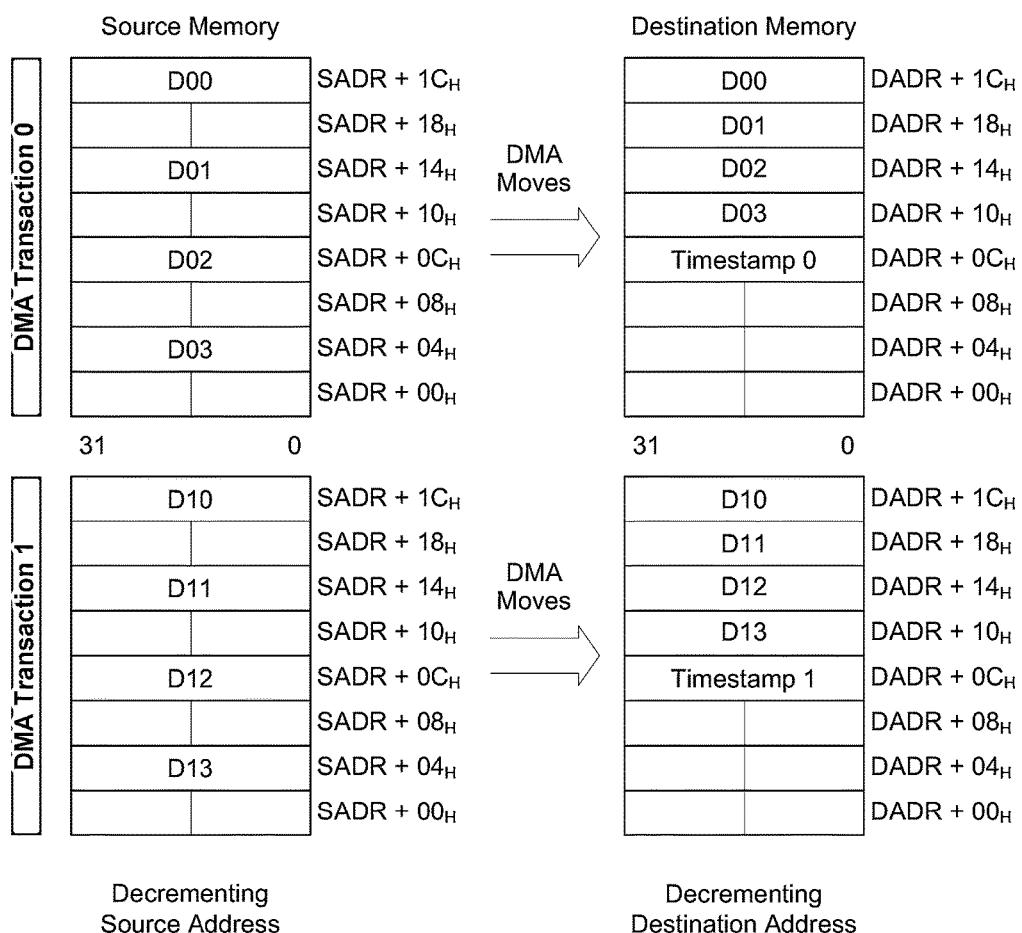
FIG. 4 is a schematic diagram illustrating a DMA transfer with an appendage of a timestamp to a decrementing destination address in accordance with another embodiment of the present disclosure.

FIG. 4 is a schematic diagram illustrating a DMA transfer with an appendage of a timestamp to a decrementing destination address in accordance with still another embodiment of the present disclosure. In this embodiment, the timestamp is appended to the next immediately lower 32-bit aligned address at destination address DADR+$0C_H$, as illustrated in FIG. 4. In this example of the present disclosure, the source and destination address are decrementing and the DMA moves the four data samples as shown in the following exemplary table:

| Data Sample | Source | Destination |
| --- | --- | --- |
| Data Sample Dn0 | SADR + $1C_H$ | DADR + $1C_H$ |
| Data Sample Dn1 | SADR + $14_H$ | DADR + $18_H$ |
| Data Sample Dn2 | SADR + $0C_H$ | DADR + $14_H$ |
| Data Sample Dn3 | SADR + $04_H$ | DADR + $10_H$ |

The timestamp functionality provided by the present disclosure enables new capabilities for proving that the operation of the DMA was triggered by the right event, and proving the destination data has been refreshed by a new block of data.

The appendage of timestamps to the destination data of the DMA transaction, operation or event according to the present disclosure can further provide a method of tracking the completion of DMA transactions. In this, timestamps can be verified by comparing two timestamp values. Furthermore, the time period between the completion of two DMA transactions can be calculated. Thereby, repeated, missing, incorrect arrival rate and/or latency of transfers can be determined. The relative completion of sequenced DMA transfers can detect bus priority inversion and other data transmission timing issues.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for transferring data between a memory and a destination memory of a motor control device of a vehicle the method comprising:
   performing, by a DMA controller, a DMA transaction comprising a sequence of one or more DMA write transfers to write data to the destination memory of the motor control device of the vehicle,
   assigning a respective timestamp to a final DMA write transfer of the sequence of DMA write transfers and storing the timestamp at the destination memory for the DMA transaction; and
   proving that the destination memory of the motor control device has been refreshed to detect that the destination memory comprises current data associated with a current DMA transaction rather than a previous data associated with a previous DMA transaction, based on verifying that the timestamp associated with the current data is different from a timestamp associated with the previous data;
   using the data in the destination memory for controlling an actuator only if the destination memory is detected to comprise current data.

2. The method of claim 1, further comprising:
   using the timestamp assigned to compare a relative timing of different DMA transactions.

3. The method of claim 1, further comprising:
   using the timestamp assigned to support tracking of different DMA transactions.

4. The method of the claim 2, further comprising:
   using the timestamp assigned for the different DMA transactions for comparing a relative temporal completion of the respective DMA transactions.

5. The method of claim 1, further comprising:
   reporting of the timestamps assigned to a host central processing unit (CPU).

6. The method of claim 1, further comprising:
   generating the timestamp from an incrementing binary sequence or a free running timer counter to support comparison and arithmetic operations.

7. The method of claim 1, further comprising:
   when a final DMA transfer of a sequence of DMA transfers is completed, performing an additional transfer to latch the current value of a timer counter and move the current value to a next address in a destination memory structure.

8. The method of claim 1, further comprising:
   processing the timestamp assigned to check a temporal sequence of different DMA transactions.

9. A system, comprising:
   a direct memory access (DMA) controller transfer section configured to transfer data between a memory and a motor control device of a vehicle via a DMA transaction comprising a sequence of one or more DMA write transfers to write data to a destination memory of the motor control device of the vehicle,
   an assignment circuitry configured to assign a respective timestamp to a final DMA write transfer of the sequence of DMA write transfers and store the timestamp at the destination memory for the DMA transaction, wherein the memory and the destination memory of the motor control device of the vehicle are separate physical entities, and
   a control circuitry adapted to prove that the destination memory of the motor control device has been refreshed to detect that the destination memory comprises current data associated with a current DMA transaction rather than a previous data associated with a previous DMA transaction, based on verifying that the timestamp associated with the current data is different from a timestamp associated with the previous data;
   wherein the control circuitry uses the data in the destination memory for controlling an actuator only if the destination memory is detected to comprise current data.

10. A direct memory access (DMA) controller, comprising:
    a transfer section configured to transfer data between a memory and a motor control device of a vehicle via a plurality of direct memory access DMA transactions, wherein each DMA transaction comprises a sequence of one or more DMA write transfers to write data to a destination memory of the motor control device of the vehicle; and
    an assignment component configured to assign a timestamp to a final DMA write transfer of the sequence of DMA write transfers to the destination memory of the motor control device of the vehicle for the given DMA transaction and store the respective timestamp at an address of the destination memory of the motor control device of the vehicle, the address having a predetermined relationship to the resultant data written to the destination memory by the sequence of DMA write transfers of the given DMA transaction;
    wherein the assignment component uses the data in the destination memory for controlling an actuator only if the destination memory is detected to comprise current data associated with a current DMA transaction rather than a previous data associated with a previous DMA transaction, based on verifying that the timestamp associated with the current data is different from a timestamp associated with the previous data.

* * * * *